(12) United States Patent
Schaefer

(10) Patent No.: US 10,976,350 B2
(45) Date of Patent: Apr. 13, 2021

(54) MEASUREMENT METHOD AND MEASUREMENT APPARATUS

(71) Applicant: Rohde & Schwarz GmbH & Co. KG, Munich (DE)

(72) Inventor: Andrew Schaefer, Oberhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 178 days.

(21) Appl. No.: 16/397,080

(22) Filed: Apr. 29, 2019

(65) Prior Publication Data

US 2020/0341034 A1    Oct. 29, 2020

(51) Int. Cl.
*G01R 13/30* (2006.01)
*G01R 13/32* (2006.01)

(52) U.S. Cl.
CPC .......... *G01R 13/305* (2013.01); *G01R 13/32* (2013.01)

(58) Field of Classification Search
CPC ............... G01R 31/26; G01R 31/2642; G01R 31/2648; G01R 31/2831; G01R 31/31702; G01R 31/11
See application file for complete search history.

(56) References Cited

U.S. PATENT DOCUMENTS

| | | | |
|---|---|---|---|
| 2005/0022086 A1* | 1/2005 | Kotz | G01R 31/2834 714/742 |
| 2015/0142382 A1* | 5/2015 | Osagawa | G04R 20/00 702/176 |
| 2016/0154104 A1* | 6/2016 | Schumann | G01S 15/34 367/91 |
| 2019/0128925 A1 | 5/2019 | Barthel et al. | |

* cited by examiner

*Primary Examiner* — Tung X Nguyen
(74) *Attorney, Agent, or Firm* — Westman, Champlin & Koehler, P.A.

(57) ABSTRACT

A measurement method, comprising acquiring, by a measurement apparatus, a plurality of at least three measurement segments, wherein each measurement segment is acquired at a corresponding measurement time, and wherein time information is gathered, wherein the time information allows to derive ratios of time differences between said measurement times; and playing back the plurality of at least three measurement segments, wherein each measurement segment is played back at a corresponding playback time, and wherein, using said time information, the playback times are chosen such that ratios of time differences between said playback times correspond to ratios of time differences between the corresponding measurement times.

20 Claims, 5 Drawing Sheets

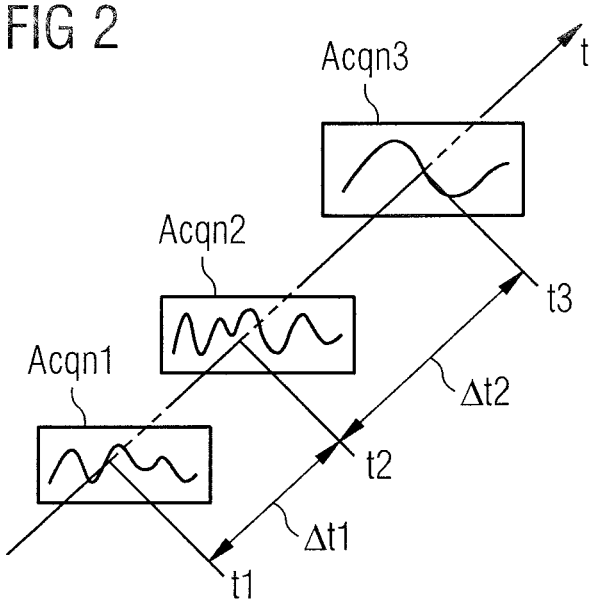
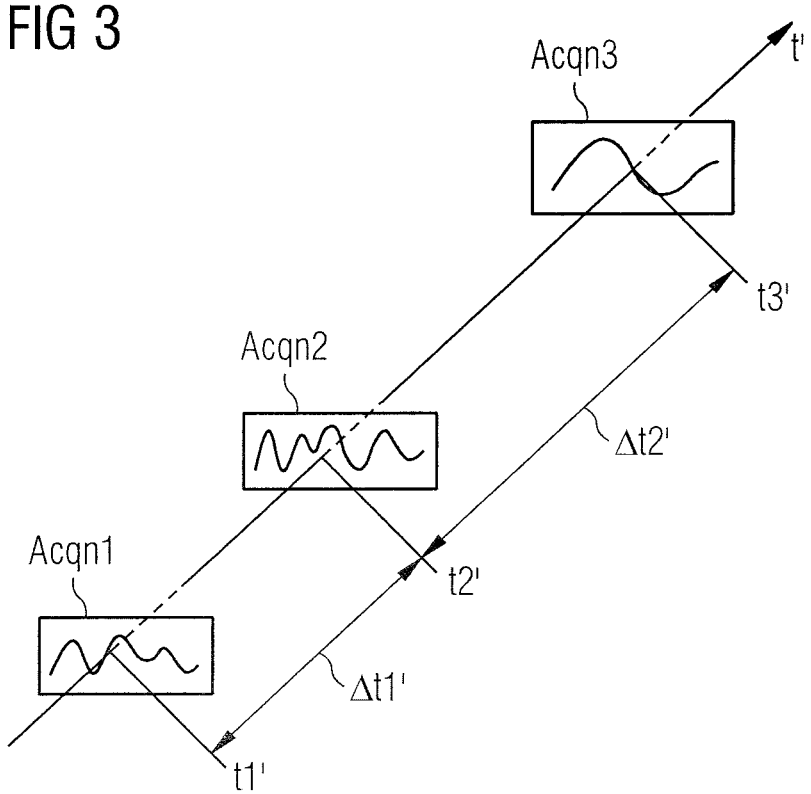

MEASUREMENT METHOD AND MEASUREMENT APPARATUS

TECHNICAL FIELD

The present invention relates to a measurement method and a measurement apparatus. The invention relates in particular to a measurement method for testing a device under test and to a corresponding measurement apparatus, including but not restricted to oscilloscopes, network analyzers, logic analyzers, and spectrum analyzers.

BACKGROUND

An electronic measurement apparatus, such as an oscilloscope, generates an electronic signal which corresponds to a measured physical quantity. For example, the measurement apparatus may determine the response of a device under test to a test signal with varying frequency.

Often, the user wants to know how the response changes if certain components or electronic properties of the device under test are adjusted or changed. Therefore, the measurement apparatus may comprise a memory for storing the measured signal. The user may then select a specific measurement segment of the plurality of measurement segments and display the measurement segment. However, it is difficult to obtain information regarding the time behavior of the measurement segments by accessing single measurement segments, only.

Therefore, there is a need for an improved visualization of the time behavior of measurements.

SUMMARY

The present invention solves this problem by a measurement method and a measurement apparatus having the features of the independent claims. Further embodiments are subject matter of the dependent claims.

According to a first aspect, a measurement method is provided, wherein a measurement apparatus acquires a plurality of at least three measurement segments. Each measurement segment is acquired at a corresponding measurement time. Time information is gathered which allows to derive ratios of time differences between said measurement times. The plurality of at least three measurement segments is played back. Each measurement segment is played back at a corresponding playback time. Using said time information, the playback times are chosen such that ratios of time differences between said playback times correspond to ratios of time differences between the corresponding measurement times.

According to a second aspect, a measurement apparatus is provided, comprising a segment acquiring unit, a display device, and a controller. The segment acquiring unit is adapted to acquire a plurality of at least three measurement segments, each measurement segment being acquired at a corresponding measurement time. The segment acquiring unit is adapted to gather time information which allows to derive ratios of time differences between said measurement times. The display device is adapted to play back the plurality of at least three measurement segments. Each measurement segment is played back at a corresponding playback time. The controller is coupled to the display device and is adapted to control the playback times. The controller is adapted to choose the playback times using said time information. The playback times are chosen such that ratios of time differences between said playback times are equal to ratios of time differences between the corresponding measurement times.

The invention proposes to display the measurement segments in a dynamic way by preserving the relative time differences between measurement times corresponding to different measurement segments. In this case, the measurement segments are played back in "true time". In other words, the time difference between the playback times of any two measurement segments is equal to the time difference between the corresponding measurement times, up to an overall factor which is the same for all time differences. Therefore, the invention provides an accurate history playback such that the time between the recorded measurement segments is exactly emulated. The overall factor may be equal to 1, such that the time differences between playback times are identical to the time differences between the corresponding measurement times. The overall factor may also be different from 1. If the time differences between playback times are smaller than the time differences between the corresponding measurement times, the measurement segments are displayed in a fast-forward mode. If the time differences between playback times are greater than the time differences between the corresponding measurement times, the measurement segments are displayed in a slow-motion mode. The overall factor may be a fixed number. However, the overall factor may also be adjustable, for instance by a user. In this case, the user can freely adjust the playback speed.

Within this disclosure, a "measurement segment" refers to a waveform, i.e., a digital representation of a section or part of a signal measured by the measurement apparatus. The "playback time" denotes a certain point in time at which the corresponding measurement segment is displayed. Preferably, the measurement segment is displayed for a certain time span until another measurement segment is displayed at the next playback time.

According to a preferred embodiment, the measurement method is a measurement method for testing a device under test. The device under test may be a printed circuit board comprising a plurality of electronic components, e.g. discrete components such as coils or capacitors as well as integrated components such as microprocessors or ASICs. The measurement apparatus applies a measurement signal to the device under test and receives a response signal from the device under test. The measurement segments acquired by the measurement apparatus correspond to said response signal. The response signal may correspond to a frequency response of the device under test.

According to a preferred embodiment of the measurement method, the measurement apparatus acquires at least one further plurality of measurement segments. The at least one further plurality of measurement segments may be acquired after acquiring the plurality of at least three measurement segments. The at least one further plurality of measurement segments may also be acquired before acquiring the plurality of at least three measurement segments. Also, at least one further plurality of measurement segments may be acquired before acquiring the plurality of at least three measurement segments and at least another further plurality of measurement segments may be acquired after acquiring the plurality of at least three measurement segments. The measurement segments of the at least one further plurality of measurement segments are played back at corresponding playback times. The measurement segments of the at least one further plurality of measurement segments are played back at least partially in parallel to the measurement segments of the plurality of at least three measurement segments. One or more of the playback times corresponding to the at least one further plurality of measurement segments may be identical to playback times corresponding to the plurality of at least three measurement segments. Additionally, or alternatively, one or more of the playback times corresponding to the at least one further plurality of measurement segments may lie between playback times of the plurality of at least three measurement segments. According to this embodiment, the plurality of at least three measurement segments can be used as a reference. The further plurality of measurement segments may be recorded and displayed in real time while at the same time performing new measurements and displaying the corresponding measurement segments. The measurement segments can be displayed in the same graph or plot for convenient visualization of changes during the measurement. Such a visualization is particularly convenient if configurations of a device under test are modified, allowing to instantaneously see the effect of the modifications on the measurement segments. Moreover, several pluralities of measurement segments may be displayed in parallel, visualizing the effects of a plurality of modifications of the configurations of the device under test.

Different pluralities of measurement segments may be blended on top of each other. This is particularly useful when there are not enough channels available or if a certain measurement was particularly time-consuming. If a user of the measurement apparatus wants to check some component of the device under test at a later time, he can replay the earlier recording to check the relative behavior of the new measurement.

According to a further embodiment of the measurement method, different pluralities of measurement segments may be displayed with different periodicities and/or at different time scaling and/or different time offsets. Such types of visualization can make it easier for a user to discern the different pluralities of measurement segments.

According to a further embodiment of the measurement method, each measurement segment of the at least one further plurality of measurement segments is acquired at a corresponding measurement time. Further time information is gathered, allowing to derive ratios of time differences between the measurement times corresponding to the measurement segments of the at least one further plurality of measurement segments. Using the further time information, the playback times for each further plurality of measurement segments are chosen such that ratios of time differences between the playback times correspond to ratios of time differences between the corresponding measurement times. According to this embodiment, the further plurality of measurement segments is also displayed in a way which preserves the ratios between the corresponding measurement times, i.e., in "true time".

According to a further embodiment of the measurement method, playing back the at least one further plurality of measurement segments is synchronized with playing back the plurality of at least three measurement segments. According to an embodiment, for the at least one further plurality of measurement segments, the first measurement segment may be displayed in parallel with the first measurement segment of the plurality of at least three measurement segments.

According to a further embodiment of the measurement method, measurement segments of the at least one further plurality of measurement segments are matched to the measurement segments of the at least three measurement segments. Synchronizing may be performed based upon events or patterns in the measurement segments of the plurality of at least three measurement segments and in the measurement segments of the at least one further plurality of measurement segments. An event may comprise a certain peak in the measurement segment which may be determined if the amplitude of the signal of the measurement segment exceeds a threshold value. A measurement segment of the plurality of at least three measurement segments comprising such a peak may be matched to a measurement segment of the at least one further plurality of measurement segments. The measurement segments are displayed such that the matched measurement segments are displayed at the same time. Patterns in the measurement segment may comprise certain frequency components which may be determined based on a spectrum analysis. If the frequency components of a measurement segments of the plurality of at least three measurement segments match with the frequency components of a measurement segment of the at least one further plurality of measurement segments, these measurement segments are displayed at the same time.

According to a further embodiment of the measurement method, acquiring of measurement segments comprises testing a device under test and synchronizing is performed based upon at least one property of the device under test. The at least one property of the device under test may be a pre-known property, such as a delay time of the device under test.

According to a further embodiment of the measurement method, the plurality of at least three measurement segments is played back in a loop. The measurement segments may be played back in an "infinite loop" or may be played back for a certain number of loops.

According to a further embodiment of the measurement method, at least one of the at least one further plurality of measurement segments is played back in a loop. Accordingly, several measurement segments may be displayed in a loop in parallel. An additional plurality of measurement segments may be displayed in real time for easy comparison with the measurement segments obtained at earlier times. Therefore, several different configurations of the device under test may be simultaneously compared.

According to a further embodiment of the measurement method, a loop time for playing back the plurality of at least three measurement segments in a loop is independent of at least one further loop time for playing back the at least one further plurality of measurement segments in a loop. The loop times for playing back the plurality of at least three measurement segments and/or for playing back the at least one further plurality of measurement segments may be adjusted by a user. Only one loop time may be adjusted. Also, all of the loop times may be adjusted independently from each other. The loop times may also be automatically adjusted, for instance based on properties of the measurement segments or based on properties of the device under test.

According to a further embodiment of the measurement method, the playback time span required to play back said plurality of at least three measurement segments can be adjusted by a user. According to this embodiment, a dynamic fast-forward mode and/or slow-motion mode is implemented, giving the user the opportunity to adjust the display speed.

According to a further embodiment of the measurement method, the time information comprises for each measurement segment a corresponding time stamp. The time stamp may comprise an absolute measurement time of the corresponding measurement segment or may comprise a relative time corresponding to a predetermined reference time.

According to a further embodiment of the measurement method, the time information comprises time differences between subsequent measurement times of measurement segments. This embodiment may be advantageous if the absolute measurement time is irrelevant.

According to a further embodiment of the measurement method, the time information comprises the ratio of time differences between said measurement times. This embodiment may be preferred if the exact time difference between consecutive measurements is irrelevant. Keeping only the ratio of time differences may reduce the required memory space.

According to a further embodiment of the measurement method, the time differences between consecutive measurement times at least partially differ from each other. In other words, the time differences are not constant. For example, the time differences may change over time according to a predefined function. The time differences may also change randomly or the user may adjust the time differences. The user may initiate each measurement using a trigger, thereby determining the measurement times and corresponding time differences.

According to a further embodiment of the measurement method, the plurality of at least three measurement segments are played back on a display. The display may be part of the measurement apparatus.

According to a further embodiment of the measurement apparatus, the segment acquiring unit is further adapted to acquire at least one further plurality of measurement segments. The display device is adapted to play back the measurement segments of the at least one further plurality of measurement segments at corresponding playback times which are at least partially identical to the playback times of the plurality of at least three measurement segments and/or which lie at least partially between the playback times of the plurality of at least three measurement segments.

According to a further embodiment of the measurement apparatus, the controller is further adapted to synchronize playing back said at least one further plurality of measurement segments with playing back said plurality of at least three measurement segments.

According to a further embodiment, the measurement apparatus comprises a user interface for receiving control signals from a user. The display device is adapted to adjust an overall playback time required to play back the plurality of at least three measurement segments based on the control signal obtained from the user.

According to a further embodiment the measurement apparatus further comprises a memory adapted to store the plurality of at least three measurement segments acquired by the segment acquiring unit. The memory may be a volatile or non-volatile data memory, e.g. a solid-state disk, memory card or the like.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which:

FIG. 2 shows a schematic acquisition of measurement segments at corresponding measurement times;

FIG. 3 shows a schematic displaying of the measurement segments at corresponding playback times;

Figure 1:
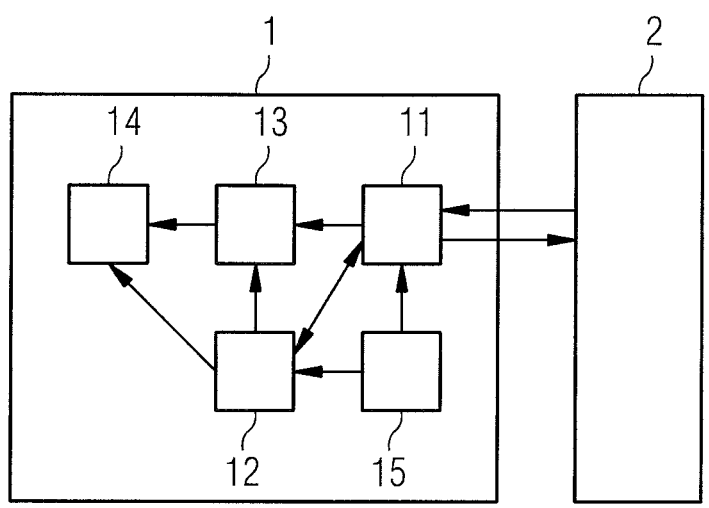
FIG. 1 shows a schematic block diagram of a measurement apparatus according to an embodiment of the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a schematic block diagram of a measurement apparatus 1, the measurement apparatus 1 being an oscilloscope. Although the invention will been described for an oscilloscope, the measurement apparatus 1 can also be any other electronic measurement device, in particular a network analyzer, logic analyzer, spectrum analyzer or the like.

The measurement apparatus 1 comprises a segment acquiring unit 11 which is connected to a device under test 2. The segment acquiring unit 11 comprises a signal generating unit, e.g. an arbitrary waveform generator, adapted to generate a test signal which is applied via an output node to a device under test 2 connected to the output node of the segment acquiring unit 11. The device under test 2 may be a printed circuit board comprising a plurality of electronic components or circuits which react to the test signal. The device under test 2 is further connected to an input node of the segment acquiring unit 11. A response signal corresponding to the response of the device under test 2 is obtained by the segment acquiring unit 11. The segment acquiring unit 11 comprises an analog-to-digital converter adapted to convert the response signal into a digital signal, i.e. to generate a digital representation of the response signal. At a plurality of measurement times, respective measurement segments corresponding to the digital representation of the response signal are generated. The segment acquiring unit 11 may be adapted to receive a signal such as a response signal from the device under test 2, detect a signal event in the received signal, i.e. by triggering, and store a certain part or segment of the signal around the event as the measurement segment.

In addition to signal generating and receiving units, the segment acquiring unit 11 may therefore comprise a computing device, e.g. a processor, e.g. a microprocessor, a central processing unit, CPU, a digital signal processor, DSP, application-specific integrated circuit, ASIC, a field-programmable gate array, FPGA, or the like. The computing device is adapted to analyze the received signal to extract the measurement signals.

A controller 12 of the measurement apparatus 1 is adapted to control the segment acquiring unit 11. The controller 12 may be adapted to adjust the measurement times. The controller 12 may include logic for implementing the described functions.

The logic may be carried out in hardware and/or software. The controller may comprise at least one of a computing device such as a processor, CPU, DSP, ASIC, FPGA, or the like.

The controller 12 is connected to a user interface 15 and can receive control signals from a user of the measurement apparatus 1. In response to the control signal obtained from the user, the controller 12 may adjust or select the measurement times. The user interface 15 may comprise at least one of buttons, switches, a keyboard, or a touch screen. At least some of the measurement times may also be predetermined. Preferably, time differences between adjacent measurement times are not constant but change over time.

The segment acquiring unit 11 further comprises a time measuring device adapted to provide time information regarding the measurement segments. The time information may comprise a time stamp for each measurement segment corresponding to the time of the measurement. The time information may additionally or alternatively comprise the time difference of the measurement to the previous measurement or to a predetermined reference time. The time difference may be measured in seconds or may be measured in arbitrary units. For instance, the time information may comprise only the ratio of time differences between different measurements corresponding to different measurement segments.

The measurement device 1 further comprises a memory 13 for storing the acquired measurement segments together with the time information, the memory 13 being a volatile or nonvolatile data memory, e.g. a solid-state disk, memory card or the like.

The measurement apparatus 1 further comprises a display 14 for displaying the measurement segments. The user interface 15 may comprise a touchscreen embedded in the display 14.

The controller 12 is adapted to select a measurement segment, stored in the memory 13, and to play back the measurement segment on the display 14. Each of the measurement segments is displayed at a corresponding playback time. The controller 12 adjusts time differences between adjacent playback times such that the ratios of these time differences is equal to the ratio of time differences between the corresponding measurement times.

FIG. 2 shows a schematic illustration of three measurement segments Acqn1, Acqn2, Acqn3, acquired at corresponding measurement times t1, t2, t3. A first measurement time difference $\Delta t1$ between the first measurement time t1 and the second measurement time t2 differs from a second measurement time difference $\Delta t2$ between the second measurement time t2 and the third measurement time t3.

As shown in FIG. 3, the acquired measurement segments Acqn1, Acqn2, Acqn3 are displayed on the display 14 at respective playback times t1', t2', t3'. A first playback time difference $\Delta t1'$ between the first playback time t1' and the second playback time t2' differs from a second playback time difference $\Delta t2'$ between the second playback time t2' and the third playback time t3'. Based on the application, a certain time difference between playback times may correspond to a time difference between the respective measurement times which is smaller, greater or equal. As an example only, a time difference between playback times of 1 second may correspond to a time difference between measurement times of 1 microsecond.

The controller 12 selects the playback time differences $\Delta t1'$, $\Delta t2'$ such that the ratio of the playback time differences $\Delta t1'/\Delta t2'$ is equal to the ratio of the corresponding measurement time differences $\Delta t1/\Delta t2$. The controller 12 may be adapted to adjust the playback time span required to play back the measurement segments Acqn1, Acqn2, Acqn3, e.g. to adjust the length of the first playback time difference $\Delta t1'$, without changing the ratio of the playback time differences $\Delta t1'/\Delta t2'$. The playback time span may be adjusted based on a control signal obtained from a user via the user interface 15, implementing fast-forward and slow-motion functions.

Several pluralities of measurement segments may be acquired in consecutive order. First, a first plurality of three measurement segments Acqn1, Acqn2, Acqn3 may be acquired, as described above. After acquiring the first plurality of measurement segments, a second plurality of measurement segments Acqn1', Acqn2', . . . AcqnN' may be obtained, wherein N is an integer number of measurement segments, preferably N>2.

Figure 4:
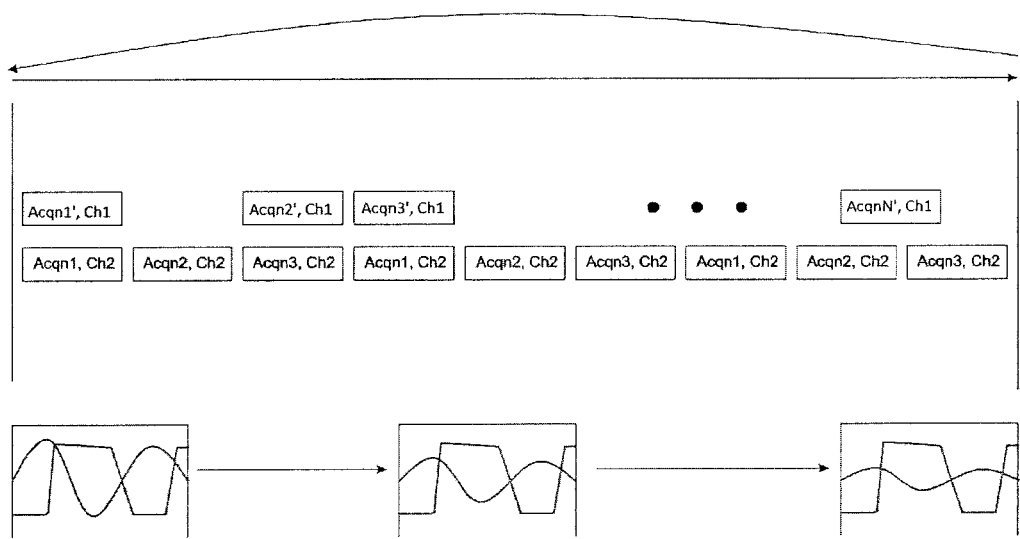
FIG. 4 shows a schematic illustration of displaying measurement segments of a first plurality of measurement segments and at the same time displaying measurement segments of a second plurality of measurement segments in a loop.

As shown in FIG. 4, the second plurality of measurement segments Acqn1', Acqn2', . . . AcqnN' is displayed in real time on the display 14 on a first channel Ch1. At the same time, the first plurality of measurement segments Acqn1, Acqn2, Acqn3 is displayed on a second channel Ch2 in an infinite loop. The measurement segments of the first plurality of measurement segments and of the second plurality of measurement segments are preferably displayed in the same coordinate system or plot, as illustrated in the lower part of FIG. 4. Preferably, at each time, one of the measurement segments of the first plurality of measurement segments and one of the measurement segments of the second plurality of measurement segments are shown in parallel.

Figure 5:
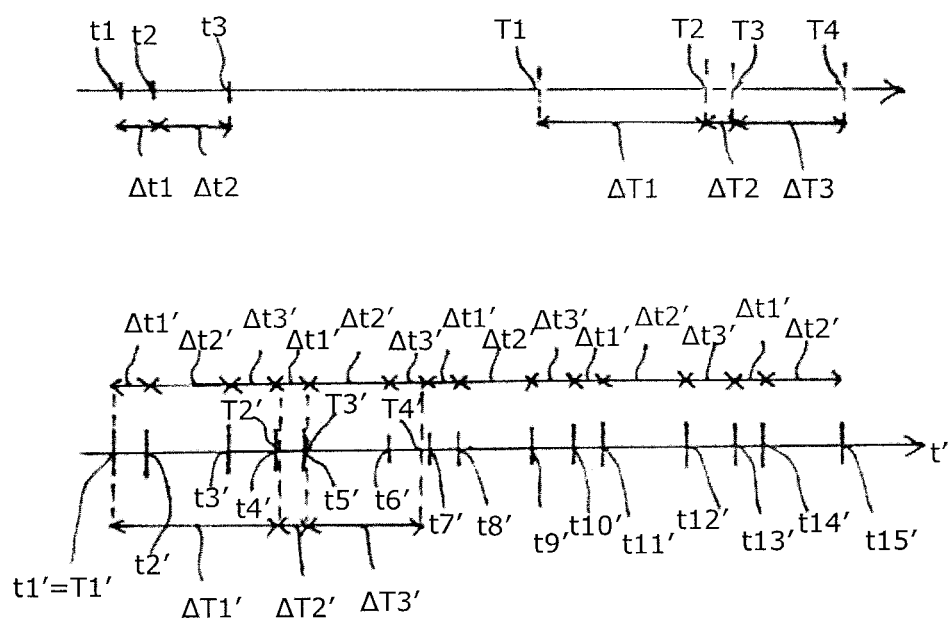
FIG. 5 shows a schematic illustration of differences between exemplary measurement times and time differences between corresponding playback times.

FIG. 5 shows a schematic illustration of differences between exemplary measurement times and time differences between corresponding playback times. As shown in the upper part of FIG. 5, three measurement segments corresponding to a first plurality of measurement segments are acquired at respective measurement times t1, t2, t3, having corresponding time differences $\Delta t1$, $\Delta t2$. Further, a plurality of four measurement segments corresponding to a second plurality of measurement segments are acquired at respective measurement times T1, T2, T3, 14, having corresponding time differences $\Delta T1$, $\Delta T2$, $\Delta T3$.

At an initial playback time t1'=T1', both the first of the first plurality of measurement segments and the first of the second plurality of measurement segments is displayed. The second and third measurement segments of the first plurality of measurement segments are displayed at playback times t2', t3' with playback time differences $\Delta t1'$, $\Delta t2'$ having a ratio equal to the ratio of the corresponding time differences $\Delta t1$, $\Delta t2$ of the measurement times. After a predetermined further playback time difference $\Delta t3'$, the first measurement segment is again displayed. In the following, the measurement segments of the first plurality of measurement segments are played back in a loop.

Similarly, the second to fourth measurement segments of the second plurality of measurement segments are displayed at playback times T2', T3', T4' with playback time differences $\Delta T1'$, $\Delta T2'$, $\Delta T3'$ having ratios equal to the ratios of the corresponding time differences $\Delta T1$, $\Delta T2$, $\Delta T3$ of the measurement times.

The controller 12 may be adapted to adjust the loop time for playing back the first plurality of measurement segments, and may be adapted to adjust the playback time span required to play back the second plurality of measurement segments. In particular, these parameters may be adjusted independently from each other. One or both of these parameters may be adapted based on the control signal obtained from the user.

Further, the controller 12 may be adapted to synchronize playing back different pluralities of measurement segments. For example, the controller 12 may be adapted to perform an analysis of the measurement segments. For instance, the controller 12 may be adapted to perform a Fourier transform of measurement segments in order to determine specific events or patterns, peaks amplitude or predetermined frequency components. Based on such an analysis, the controller 12 may match a measurement segment of the first plurality of measurement segments to a measurement segment of the second plurality of measurement segments, if the events or patterns correspond to each other within certain bounds. In this case, the controller 12 may play back the corresponding segments simultaneously, thereby synchronizing playing back the first plurality of measurement segments and playing back the second plurality of measurement segments.

The controller 12 may also synchronize playing back the first plurality of measurement segments and playing back the second plurality of measurement segments based on a property of the device under test 2 which may be a preknown property stored in memory 13 or which may be extracted by the controller 12 from the response signal obtained from the device under test 2. For example, the controller 12 may take a delay time of the device under test 2 into account in order to synchronize the playback times.

Figure 6:
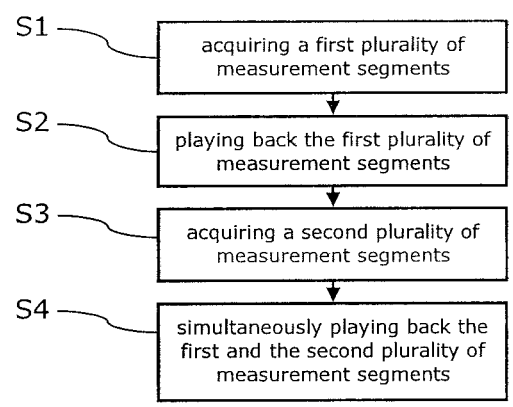
FIG. 6 shows a flow diagram illustrating a measurement method according to an embodiment of the invention.

FIG. 6 shows a flow diagram illustrating a measurement method according to an embodiment of the invention.

In a first method step S1, a measurement apparatus 1 acquires at least three measurement segments of a first plurality of measurement segments. Each measurement segment is acquired at a respective measurement time, the measurement times being preferably unevenly distributed. In other words, the time differences between subsequent measurement times preferably differ for at least some of the measurement times. Acquiring the measurement segments may comprise receiving a signal such as a response signal from a device under test 2, detecting a signal event in the received signal, i.e. triggering, and storing a certain part or segment of the signal around the event as the measurement segment.

The measurement apparatus 1 stores the measurement segments together with time information in a memory 13 of the measurement apparatus 1. The time information may comprise time stamps or any other information which allows to reconstruct the ratios of time differences between different measurement times.

In step S2, automatically or after an input of a user of the measurement apparatus 1, the first plurality of measurement segments are played back on a display 14 of the measurement apparatus 1. The measurement segments are displayed in such a way that the ratios of time differences between the playback times correspond to the ratios of time differences between the corresponding measurement times. To ensure this criterion, the playback times may be computed based on the measurement times. First, the playback speed of playing back the measurement segments is fixed by choosing a predetermined reference time difference between the playback time of the first measurement segment and the second measurement segment. Next, the playback times of the consecutive third to N-th playback times is fixed, where N denotes the total number of measurement segments. Each playback time is determined such that the ratio of the reference playback time difference to the time difference between the playback time to be determined and the previous playback time is equal to the ratio of the corresponding time differences of the measurement times.

In a further step S3, a second plurality of measurement segments is acquired after acquiring the first plurality of measurement segments.

In step S4, the first and second plurality of measurement segments are played back in parallel. The first and second plurality of measurement segments may be displayed in a single plot or may be displayed in two different plots on the display 14 of the measurement apparatus 1.

Preferably, the second plurality of measurement segments is also displayed in such a way that the ratios of time differences between the playback times correspond to ratios of time differences between the corresponding measurement times.

A user of the measurement apparatus 1 may change one or several playback parameters, such as at least one of the overall playback speed of the first plurality of measurement segments, the overall playback speed of the second plurality of measurement segments, and whether playing back the first and/or second plurality of measurement segments is repeated in a loop or not.

Whereas the method has been described for two pluralities of measurement segments, an arbitrary plurality of measurement segments may be acquired and displayed. Further, only one plurality of measurement segments may be acquired.

Playing back the measurement segments of different plurality of measurement segments may be synchronized based on properties of the device under test and/or based on events or patterns in the measurement segments.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A measurement method, comprising the steps:
acquiring, by a measurement apparatus, a plurality of at least three measurement segments, wherein each measurement segment is acquired at a corresponding measurement time, and wherein time information is gathered, wherein the time information allows to derive ratios of time differences between said measurement times; and
playing back, by a display device, the plurality of at least three measurement segments, wherein each measurement segment is played back at a corresponding playback time, and wherein a controller chooses, using said time information, the playback times such that ratios of time differences between said playback times correspond to ratios of time differences between the corresponding measurement times.

2. The measurement method according to claim 1, further comprising the step of acquiring, by said measurement apparatus, at least one further plurality of measurement segments, wherein said measurement segments of said at least one further plurality of measurement segments are played back at corresponding playback times which are at least partially identical to said playback times of said plurality of at least three measurement segments and/or which lie at least partially between said playback times of said plurality of at least three measurement segments.

3. The measurement method according to claim 2, wherein each measurement segment of said at least one further plurality of measurement segments is acquired at a corresponding measurement time, wherein further time information is gathered, wherein the further time information allows to derive ratios of time differences between said measurement times corresponding to said measurement segments of said at least one further plurality of measurement segments, and wherein, using said further time information, for each further plurality of measurement segments, the playback times are chosen such that ratios of time differences between said playback times correspond to ratios of time differences between the corresponding measurement times.

4. The measurement method according to claim 2, wherein playing back said at least one further plurality of measurement segments is synchronized with playing back said plurality of at least three measurement segments.

5. The measurement method according to claim 4, wherein said synchronizing is performed based upon events or patterns in said measurement segments of said plurality of at least three measurement segments and in said measurement segments of said at least one further plurality of measurement segments.

6. The measurement method according to claim 4, wherein said acquiring of measurement segments comprises testing a device under test, wherein said synchronizing is performed based upon at least one property of said device under test.

7. The measurement method according to claim 4, wherein said plurality of at least three measurement segments is played back in a loop.

8. The measurement method according to claim 7, wherein said at least one further plurality of measurement segments is played back in a loop.

9. The measurement method according to claim 8, wherein a loop time for playing back said plurality of at least three measurement segments in a loop is independent of at least one further loop time for playing back said at least one further plurality of measurement segments in a loop.

10. The measurement method according to claim 1, wherein a playback time span required to play back said plurality of at least three measurement segments can be adjusted by a user.

11. The measurement method according to claim 1, wherein said time information comprises for each measurement segment a corresponding time stamp.

12. The measurement method according to claim 1, wherein said time information comprises time differences between subsequent measurement times of measurement segments.

13. The measurement method according to claim 1, wherein the time differences between consecutive measurement times at least partially differ from each other.

14. The measurement method according to claim 1, wherein the plurality of at least three measurement segments are played back on a display.

15. A measurement apparatus, comprising:
a segment acquiring unit adapted to acquire a plurality of at least three measurement segments, wherein each measurement segment is acquired at a corresponding measurement time, and wherein the segment acquiring unit is adapted to gather time information, wherein the time information allows to derive ratios of time differences between said measurement times;
a display device adapted to play back the plurality of at least three measurement segments, wherein each measurement segment is played back at a corresponding playback time, and
a controller adapted to control the playback times, wherein the controller is adapted to choose, using said time information, the playback times such that ratios of time differences between said playback times correspond to ratios of time differences between the corresponding measurement times.

16. The measurement apparatus according to claim 15, wherein said segment acquiring unit is further adapted to acquire at least one further plurality of measurement segments, wherein said display device is adapted to play back said measurement segments of said at least one further plurality of measurement segments at corresponding playback times which are at least partially identical to said playback times of said plurality of at least three measurement segments and/or which lie at least partially between said playback times of said plurality of at least three measurement segments.

17. The measurement apparatus according to claim 15, wherein said controller is further adapted to synchronize playing back said at least one further plurality of measurement segments with playing back said plurality of at least three measurement segments.

18. The measurement apparatus according to claim 15, further comprising a user interface for receiving control signals from a user, wherein said display device is adapted to adjust an overall playback time required to play back said plurality of at least three measurement segments based on said control signal obtained from the user.

19. The measurement apparatus according to claim 15, further comprising a memory adapted to store said plurality of at least three measurement segments acquired by said segment acquiring unit.

20. A measurement method, comprising the steps:

acquiring, by a measurement apparatus, a plurality of at least three measurement segments, wherein each measurement segment is acquired at a corresponding measurement time, and wherein time information is gathered, wherein the time in-formation allows to derive ratios of time differences between said measurement times; and playing back the plurality of at least three measurement segments, wherein each measurement segment is played back at a corresponding playback time, and wherein, using said time information, the playback times are chosen such that ratios of time differences between said playback times correspond to ratios of time differences between the corresponding measurement times, further comprising the step of acquiring, by said measurement apparatus, at least one further plurality of measurement segments, wherein said measurement segments of said at least one further plurality of measurement segments are played back at corresponding playback times which are at least partially identical to said playback times of said plurality of at least three measurement segments and/or which lie at least partially between said playback times of said plurality of at least three measurement segments.

\* \* \* \* \*